United States Patent
Kubo et al.

(10) Patent No.: US 6,674,016 B2
(45) Date of Patent: Jan. 6, 2004

(54) ELECTRONIC COMPONENT

(75) Inventors: Masahiro Kubo, Tokyo (JP); Ichiro Hazeyama, Tokyo (JP); Sakae Kitajo, Tokyo (JP); Koji Matsui, Tokyo (JP); Kazumasa Igarashi, Ibaraki (JP)

(73) Assignees: Nitto Denko Corporation, Osaka (JP); NEC Corporation, Tokyo (JP)

( * ) Notice: Subject to any disclaimer, the term of this patent is extended or adjusted under 35 U.S.C. 154(b) by 10 days.

(21) Appl. No.: 10/246,666

(22) Filed: Sep. 19, 2002

(65) Prior Publication Data

US 2003/0116347 A1 Jun. 26, 2003

(30) Foreign Application Priority Data

Oct. 16, 2001 (JP) .................................. P2001-318104

(51) Int. Cl.$^7$ ................................................. H05K 1/16
(52) U.S. Cl. ................ 174/260; 174/261; 174/52.4; 361/760; 361/771; 257/737; 257/778
(58) Field of Search ................ 174/260, 261, 174/52.4; 361/760, 771, 783; 257/737, 738, 778

(56) References Cited

U.S. PATENT DOCUMENTS

| | | | | |
|---|---|---|---|---|
| 5,250,848 A | * | 10/1993 | Christie et al. | 257/778 |
| 5,656,862 A | * | 8/1997 | Papathomas et al. | 257/778 |
| 5,739,187 A | * | 4/1998 | Asano et al. | 523/451 |
| 5,760,337 A | * | 6/1998 | Iyer et al. | 174/52.2 |
| 5,930,598 A | * | 7/1999 | Wille et al. | 438/108 |
| 6,100,597 A | * | 8/2000 | Nakamura | 257/787 |
| 6,111,323 A | * | 8/2000 | Carter et al. | 257/787 |
| 6,121,689 A | * | 9/2000 | Capote et al. | 257/783 |
| 6,376,100 B1 | * | 4/2002 | Shiobara et al. | 428/620 |
| 6,376,923 B1 | * | 4/2002 | Sumita et al. | 257/791 |

\* cited by examiner

*Primary Examiner*—Kamand Cuneo
*Assistant Examiner*—I. B. Patel
(74) *Attorney, Agent, or Firm*—Sughrue Mion, PLLC

(57) ABSTRACT

An electronic component is described, which contains a printed circuit board having electrodes for connection and a semiconductor chip having electrodes for connection which is mounted on said circuit board with their electrodes facing those of the circuit board, the gap between the circuit board and the semiconductor chip being filled with a sealing resin layer, wherein the sealing resin layer is formed of a liquid epoxy resin composition containing (A) a liquid epoxy resin, (B) a curing agent, (C) an inorganic filler, and (D) an N,N,N',N'-tetrasubstituted fluorine-containing aromatic diamine derivative.

11 Claims, 1 Drawing Sheet

ELECTRONIC COMPONENT

FIELD OF THE INVENTION

This invention relates to an electronic component in which a semiconductor chip is face down mounted on a printed circuit board (hereinafter PCB) by flip-chip bonding, which has satisfactory repairability as well as high connection reliability.

BACKGROUND OF THE INVENTION

In recent years, direct chip attachment technology such as flip chip bonding has engaged attention. So-called C4 (controlled collapse chip connection) joining is a famous interconnection technology for flip chip bonding in which high-melting solder bumps formed on the chip side are electrically connected to the solder pads formed on a ceramic wiring board.

Where a resin-based circuited substrate, such as an epoxy-glass laminate PCB, is used in flip chip bonding in place of a ceramic circuited board, there arises a poor connection reliability problem because the solder joints are broken due to thermal expansion mismatch between a silicon chip and the resin-based substrate. It is a generally followed practice as a countermeasure against this problem that the gap between a chip and a resin-based circuited substrate is sealed (underfilled) by using a liquid resin composition to diffuse thermal stress and improve reliability.

Thermosetting resin compositions mainly containing an epoxy resin, etc. are generally used as an underfill material. However, thermosetting resin compositions have little repairability or reworkability as an underfill material because, after once cured by heating, they exhibit high adhesion and do not melt, nor dissolve, nor decompose. After underfilling, electronic devices if found defective in electrical interconnection cannot help being scrapped. In the light of the today's concern of environmental conservation, it is necessary to minimize unrecyclable waste. From this viewpoint, it has been demanded to develop a reworkable underfill material.

SUMMARY OF THE INVENTION

An object of the present invention is to provide a electronic component which is repairable if found defective in electrical connection after underfilling.

In order to accomplish the above object, the present inventors have investigated epoxy resin compositions as an underfill material for filling the gap between a PCB and a semiconductor chip. As a result they have found that a liquid epoxy resin composition mainly containing a liquid epoxy resin, a curing agent, and an inorganic filler and having incorporated therein a specific fluorine-containing aromatic diamine compound provides a cured product (sealing resin) that is solvated and subsequently swollen with a specific solvent. The solvent-swollen cured resin film reduces strength and adhesion and becomes capable of being stripped mechanically, thereby enabling repair of the assembly. The fluorine-containing aromatic diamine compound serves to reduce a solubility parameter (SP) of a cured resin because of its trifluoromethyl group or fluorine atom to make a cured resin ready to be solvated and then swollen with a specific solvent. The inventors have ascertained that N,N,N',N'-tetrasubstitution of the fluorine-containing aromatic diamine derivative enhances the solvation and swelling capabilities to an extent enabling reworking.

The present invention provides an electronic component containing a PCB having electrodes for connection and a semiconductor chip having electrodes for connection which is mounted on the PCB with their electrodes facing those of the PCB, the gap between the PCB and the semiconductor chip being filled with a sealing resin layer, wherein the sealing resin layer is formed of a liquid epoxy resin composition comprising (A) a liquid epoxy resin, (B) a curing agent, (C) an inorganic filler, and (D) an N,N,N',N'-tetrasubstituted fluorine-containing aromatic diamine derivative.

It is a preferred embodiment of the invention to use, as component (D), an N,N,N',N'-tetrasubstituted fluorine-containing aromatic diamine derivative represented by formula (I):

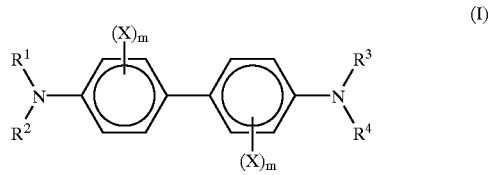

wherein X represents a fluorine atom, $C_nF_{2n+1}$ where n is an positive integer of 1 to 10, or a combination thereof; m represents a positive integer of 1 to 4; and $R^1$, $R^2$, $R^3$, and $R^4$, which may be the same or different, each represents a monovalent organic substituent other than a hydrogen atom. The resin composition containing the derivative of formula (I) exhibits rapid swellability to assure high repairability.

It is a further preferred embodiment of the invention that:

the curing agent as component (B) contains at least one fluorine-containing aromatic diamine compound represented by formula (II):

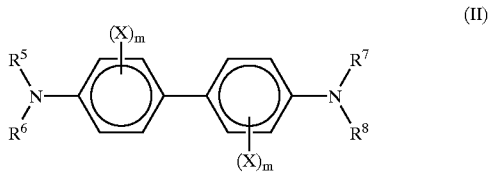

wherein X represents a fluorine atom, $C_nF_{2n+1}$ where n is an positive integer of 1 to 10, or a combination thereof; m represents a positive integer of 1 to 4; $R^5$, $R^6$, $R^7$, and $R^8$, which may be the same or different, each represents a hydrogen atom or a monovalent organic substituent, provided that at least one of $R^5$, $R^6$, $R^7$, and $R^8$ is a hydrogen atom and/or that:

the liquid epoxy resin composition contains a prepolymer resulting from the reaction between at least one fluorine-containing aromatic diamine compound represented by formula (II) and the liquid epoxy resin as component (A).

According to this preferred embodiment, an improved curing rate is obtained. Besides, the state of the epoxy resin composition to be used as an underfill material can be controlled between liquid to paste by using the prepolymer so that a liquid epoxy resin composition can be prepared with ease without involving complicated procedures in the steps of metering and subsequent dispersing.

DESCRIPTION OF THE REFERENCE NUMERALS AND SIGNS

Figure 1:
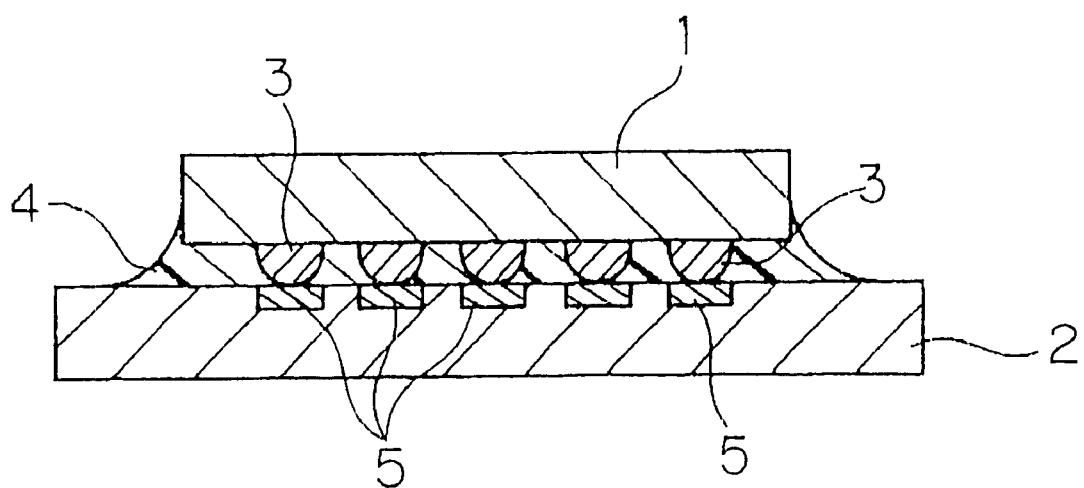
FIG. 1 is a schematic cross-section of an electronic component according to the present invention.

1: semiconductor chip (flip chip)
2: PCB
3: electrodes for connection of semiconductor chip (solder bumps)
4: sealing resin layer
5: electrodes for connection of PCB (solder pads)

DETAILED DESCRIPTION OF THE INVENTION

As shown in FIG. 1, the electronic component of the present invention contains a PCB 2 having electrodes for connection (solder pads) 5 and a semiconductor chip (flip chip) 1 having electrodes for connection (solder bumps) 3. The semiconductor chip 1 is mounted on the PCB 2 with the solder bumps 3 and the solder pads 5 facing each other. The gap between the PCB 2 and the semiconductor chip 1 is filled with a cured sealing resin layer 4 which is made from a liquid epoxy resin composition.

The electrode configuration of the electronic component is not limited to that shown in FIG. 1 where the electrodes 3 on the chip 1 side have a bump form. For example, the electrodes 5 on the PCB 2 side may have the form of bumps.

The liquid epoxy resin composition as an underfill material forming the sealing resin layer 4 is obtained by compounding (D) an N,N,N',N'-tetrasubstituted fluorine-containing aromatic diamine derivative with (A) a liquid epoxy resin, (B) a curing agent, and (C) an inorganic filler. The term "liquid" in "liquid epoxy resin composition" as used in the present invention means that the composition shows flowability at 25° C. In other words, the liquid resin composition has a viscosity ranging from 0.01 mPa·s to 10,000 Pa·s at 25° C. The viscosity can be measured with a corn-plate rotational viscometer (EMD viscometer, supplied by Tokyo Keiki K.K.) in accordance with JIS K7117-2.

The liquid epoxy resin as component (A) is not particularly limited as long as it contains two or more epoxy groups per molecule. Useful liquid epoxy resins include bisphenol A epoxy resin, bisphenol F epoxy resin, hydrogenated bisphenol A epoxy resin, bisphenol AF epoxy resin, phenol novolak epoxy resin, and derivatives thereof; liquid epoxy resins derived from polyhydric alcohols and epichlorohydrin, and derivatives thereof; various glycidyl type liquid epoxy resins, such as glycidylamine type, hydantoin type, aminophenol type, aniline type, and toluidine type, and derivatives thereof (see Jitsuyo Plastic Jiten Henshu Iinkai (ed.), *Jitsuyo Plastic Jiten Zairyo-hen* (1996), pp. 211–225); and liquid mixtures of these liquid epoxy resins and various glycidyl type solid epoxy resins. The liquid epoxy resins may be used either individually or as a combination of two or more thereof.

Any curing agent capable of curing the liquid epoxy resin (A) can be used as component (B). It is preferable to use at least one aromatic diamine compound. It is still preferable to use at least one fluorine-containing aromatic diamine compound to make a cured resin more solvatable and swellable with a specific solvent.

The aromatic diamine compound as component (B) includes monocyclic diamines, such as p-phenylenediamine, m-phenylenediamine, 2,5-toluenediamine, 2,4-toluenediamine, 4,6-dimethyl-m-phenylenediamine, and 2,4-diaminomesitylene; dicyclic diamines, such as 4,4'-diaminodiphenyl ether, 3,3'-diaminodiphenyl ether, 3,4'-diaminodiphenyl ether, 4,4'-diaminodiphenylmethane, 3,3'-diaminodiphenylmethane, 4,4'-diaminodiphenyl sulfone, 3,3'-diaminodiphenyl sulfone, 4,4'-diaminodiphenyl sulfide, 3,3'-diaminodiphenyl sulfide, 4,4'-diaminobenzophenone, and 3,3'-diaminobenzophenone; tricyclic diamines, such as 1,4-bis(4-aminophenoxy)benzene, 1,4-bis(3-aminophenoxy)benzene, 1,3-bis(4-aminophenoxy)benzene, and 1,3-bis(3-aminophenoxy)benzene; and tetracyclic diamines, such as 4,4'-di(4-aminophenoxy)diphenyl sulfone, 4,4'-di(3-aminophenoxy)diphenyl sulfone, 4,4'-di(4-aminophenoxy)diphenylpropane, 4,4'-di(3-aminophenoxy)diphenylpropane, 4,4'-di(4-aminophenoxy)diphenyl ether, and 4,4'-di(3-aminophenoxy)diphenyl ether. These aromatic diamines may be used either individually or as a combination of two or more thereof.

The fluorine-containing aromatic diamine compounds are fluorine-substituted aromatic diamines containing a primary amino group and derivatives thereof, such as 2,2'-ditrifluoromethyl-4,4'-diaminobiphenyl, 2,2-bis(4-aminophenyl)hexafluoropropane, 2,2-bis(3-amino-4-methylphenyl)hexafluoropropane, 2,2-bis(3-amino-4-hydroxyphenyl)hexafluoropropane, 2,2-bis[4-(4-aminophenoxy)phenyl]hexafluoropropane, 2,2-bis(3-amino-4,5-dimethylphenyl)hexafluoropropane, 2,2-bis(4-hydroxy-3-aminophenyl)hexafluoropropane, 4,4'-bis[2-(4-carboxyphenyl)hexafluoroisopropyl]diphenyl ether, and 4,4'-bis[2-(4-aminophenoxyphenyl)hexafluoroisopropyl]diphenyl ether. They may be used either individually or as a combination of two or more thereof.

Of the fluorine-containing aromatic diamine compounds preferred are fluorine- or fluoroalkyl-substituted diaminobiphenyls represented by formula (II) shown below for prolonging the room-temperature pot life of the resulting liquid epoxy resin composition.

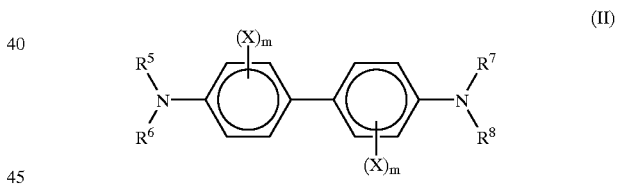

(II)

wherein X represents a fluorine atom, $C_nF_{2n+1}$ where n is an positive integer of 1 to 10, or a combination thereof; m represents a positive integer of 1 to 4; $R^5$, $R^6$, $R^7$, and $R^8$, which may be the same or different, each represents a hydrogen atom or a monovalent organic substituent, provided that at least one of $R^5$, $R^6$, $R^7$, and $R^8$ is a hydrogen atom.

In formula (II), $R^5$, $R^6$, $R^7$, and $R^8$ each represents a hydrogen atom or a monovalent organic substituent, provided that at least one of them is a hydrogen atom. The monovalent organic substituent includes a saturated alkyl group represented by —$C_nH_{2n+1}$ (n is an integer of 1 to 10) an aryl group, a 3-alkoxy-substituted-2-hydroxypropyl group represented by —$CH_2CH(OH)CH_2$—$OC_nH_{2n+1}$ (n is an integer of 1 to 10), and a 3-aryl-substituted-2-hydroxypropyl group represented by —$CH_2CH(OH)CH_2$—O—$R^9$ ($R^9$ is an aryl group). As long as the above provision is fulfilled, $R^5$, $R^6$, $R^7$, and $R^8$ may be the same or different.

Of the compounds represented by formula (II), 2,2'-ditrifluoromethyl-4,4'-diaminobiphenyl is a particularly preferred curing agent. Having the least active hydrogen equivalent, it serves at a reduced compounding ratio, thereby reducing the viscosity of the solventless one pack epoxy resin composition.

The curing agent (B) is preferably used in an amount of 0.4 to 1.6, particularly 0.6 to 1.2, in terms of the number of active hydrogen atoms per epoxy group of the liquid epoxy resin (A). Where the number of active hydrogen atoms exceeds 1.6 per epoxy group, the liquid epoxy resin composition tends to have an increased viscosity. Where it is smaller than 0.4, a cured product of the liquid epoxy resin composition tends to have a lowered glass transition temperature.

In the present invention, particularly where a polyfunctional aliphatic liquid epoxy resin is used as component (A), it is desirable that the above-described fluorine-containing aromatic diamine compound and the polyfunctional aliphatic liquid epoxy resin be allowed to preliminarily react with each other to form a prepolymer. In this case, it is possible to suppress void formation which may be caused by volatilization of low-boiling components present in the polyfunctional aliphatic liquid epoxy resin, etc.

The prepolymer is a reaction product between a polyfunctional aliphatic liquid epoxy compound having two or more epoxy groups per molecule and the fluorine-containing aromatic diamine compound. The reaction is usually carried out by charging predetermined amounts of the reactants into a reaction vessel in the absence of a catalyst and heating the mixture in a nitrogen stream at about 60 to 120° C. until a desired molecular weight is reached. The prepolymer preferably has a polystyrene equivalent molecular weight of about 400 to 5000. By forming such a prepolymer, low-boiling and therefore volatile low-molecular weight components are prevented from volatilizing to cause void formation in the sealing resin layer.

The above-mentioned polyfunctional aliphatic liquid epoxy resins include polyfunctional glycidyl ethers of aliphatic diols or triols or aliphatic polyfunctional alcohols, such as ethylene glycol diglycidyl ether, propylene glycol diglycidyl ether, butanediol diglycidyl ether, neopentyl glycol diglycidyl ether, diglycidyl aniline, trimethylolpropane diglycidyl ether, trimethylolpropane triglycidyl ether, glycerol diglycidyl ether, and glycerol triglycidyl ether.

The inorganic filler which can be used as component (C) includes silica powders of synthetic silica, fused silica, etc., and other various powders, such as alumina, silicon nitride, aluminum nitride, boron nitride, magnesia, calcium silicate, magnesium hydroxide, aluminum hydroxide, and titanium oxide. Spherical silica powder is particularly preferred of them, for it is greatly effective in reducing the viscosity of the liquid epoxy resin composition. The inorganic filler preferably has a maximum particle size of 24 µm or smaller. With the maximum size being 24 µm or smaller, the inorganic filler preferably has an average particle size of 10 µm or smaller, particularly 1 to 8 µm. The maximum particle size and the average particle size can be measured with, e.g., a laser diffraction particle size analyzer (Type LA-910, supplied by HORIBA).

The inorganic filler (C) is preferably used in an amount of 10 to 80%, particularly 40 to 70%, by weight based on the liquid epoxy resin composition. Where it is used in an amount less than 10% by weight, the effect on reduction of linear expansion coefficient of a cured resin tends to be insufficient. Amounts exceeding 80% by weight tend to result in an increased viscosity of the liquid epoxy resin composition.

The liquid epoxy resin composition of the present invention is characterized by containing an N,N,N',N'-tetrasubstituted fluorine-containing aromatic diamine derivative as component (D) in addition to components (A), (B), and (C). The N,N,N',N'-tetrasubstituted fluorine-containing aromatic diamine derivative is preferably one represented by formula (I):

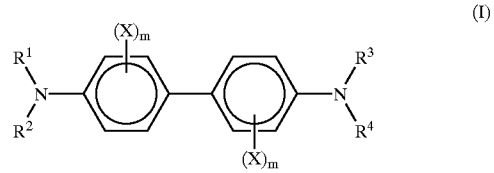

wherein X represents a fluorine atom, $C_nF_{2n+1}$ where n is an positive integer of 1 to 10, or a combination thereof; m represents a positive integer of 1 to 4; and $R^1$, $R^2$, $R^3$, and $R^4$, which may be the same or different, each represents a monovalent organic substituent other than a hydrogen atom.

The derivative of formula (I) can be prepared by, for example, allowing the above-described fluorine-containing aromatic diamine to react with a monoepoxy compound having one epoxy group per molecule.

In formula (I), $R^1$, $R^2$, $R^3$, and $R^4$ each represents a monovalent organic substituent ($\neq$H). The monovalent organic substituent includes a saturated alkyl group represented by —$C_nH_{2n+1}$ (n is an integer of 1 to 10), an aryl group, a 3-alkoxy-substituted -2-hydroxypropyl group represented by —$CH_2CH(OH)CH_2$—$OC_nH_{2+1}$ (n is an integer of 1 to 10), and a 3-aryl-substituted-2-hydroxypropyl group represented by —$CH_2CH(OH)CH_2$—O—$R^9$ ($R^9$ is an aryl group). $R^1$, $R^2$, $R^3$, and $R^4$ may be the same or different.

The reaction between the fluorine-containing aromatic diamine and the monoepoxy compound is usually carried out by charging predetermined amounts of the reactants into a reaction vessel in the absence of a catalyst and heating the mixture in a nitrogen stream at about 60 to 120° C. until the epoxy group content is consumed. The reaction results in formation of a tetrasubstituted derivative as shown by formula (I).

The monoepoxy compound having one epoxy group per molecule includes, but is not limited to, n-butyl glycidyl ether, allyl glycidyl ether, 2-ethylhexyl glycidyl ether, styrene oxide, phenyl glycidyl ether, cresyl glycidyl ether, lauryl glycidyl ether, p-sec-butylphenyl glycidyl ether, nonylphenyl glycidyl ether, carbinol glycidyl ether, glycidyl methacrylate, vinylcyclohexene monoepoxide, and α-pinene oxide. They may be used either individually or as a combination of two or more thereof.

The N,N,N',N'-tetrasubstituted nitrogen-containing aromatic diamine derivative (D) is preferably used in an amount of 10 to 70%, particularly 20 to 40%, by weight based on the total organic components of the liquid epoxy resin composition. When used in amounts less than 10%, the derivative hardly manifests the effect of rapid swellability which will lead to repairability. Where used in amounts more than 70%, a cured product of the resulting liquid epoxy resin composition tends to have insufficient strength for withstanding heat cycles.

If desired, the liquid epoxy resin composition can contain known cure accelerators for curing time reduction. Useful cure accelerators include tertiary amines, e.g., 1,8-diazabicyclo(5.4.0)undecene-7 and triethylenediamine, imidazoles, e.g., 2-methylimidazole, phosphorus-based cure accelerators, e.g., triphenylphosphine and tetraphenylphosphonium tetraphenylborate, acidic catalysts, e.g., salicylic acid, and Lewis acids, e.g., acetylacetonatocopper and acetylacetonatozinc. These cure accelerators may be used either alone or as a combination thereof.

Among these cure accelerators preferred are phosphonium salts, such as tetraphenylphosphonium tetraphenylborate, and Lewis acids, such as acetylacetonatocopper and acetylacetonatozinc, for they do not impair the stability of the liquid epoxy resin composition.

While not limiting, the amount of the cure accelerator to be compounded is preferably selected so that a mixture consisting of components (A), (B), and (D) may have a desired curing rate. The amount to be used is easily decided by, for example, measuring the gelling time on a hot plate as a measure of a curing rate. An exemplarily advisable amount is 0.01 to 3% by weight based on the liquid epoxy resin composition.

If desired, the liquid epoxy resin composition can further comprise a silane coupling agent for the purpose of improving adhesion to an adherend, enhancing interfacial adhesion to inorganic fillers, and the like. The silane coupling agent includes, but is not limited to, β-(3,4-epoxycyclohexyl) ethyltrimethoxysilane, γ-glycidoxypropyltrimethoxysilane, and γ-glycidoxypropylmethyldiethoxysilane.

In addition to the above-described components, a reactive diluent can be added appropriately for the purpose of reducing the viscosity, and the like. A reactive diluent can contain volatile low-boiling compounds that may cause void formation in the sealing resin layer at a prescribed curing temperature of the liquid epoxy resin composition. Therefore, a reactive diluent should be used after having removed therefrom such volatile low-boiling components. Use of a reactive diluent which is volatile per se is restricted since voids are apt to be formed in the sealing resin layer at a curing temperature of the liquid epoxy resin composition.

Useful reactive diluents include n-butyl glycidyl ether, allyl glycidyl ether, 2-ethylhexyl glycidyl ether, styrene oxide, phenyl glycidyl ether, cresyl glycidyl ether, lauryl glycidyl ether, p-sec-butylphenyl glycidyl ether, nonylphenyl glycidyl ether, carbinol glycidyl ether, glycidyl methacrylate, vinylcyclohexene monoepoxide, α-pinene oxide, tertiary carboxylic acid glycidyl ethers, diglycidyl ether, (poly)ethylene glycol glycidyl ether, (poly)propylene glycol glycidyl ether, bisphenol A-propylene oxide adducts, bisphenol A epoxy resin-polymerized fatty acid partial adducts, polymerized fatty acid polyglycidyl ethers, butanediol diglycidyl ether, vinylcyclohexene dioxide, neopentyl glycol diglycidyl ether, diglycidyl aniline, trimethylolpropane diglycidyl ether, trimethylolpropane triglycidyl ether, glycerol diglycidyl ether, and glycerol triglycidyl ether. They may be used either individually or as a combination of two or more thereof.

If desired, the liquid epoxy resin composition can contain flame retardants and flame retardation assistants, such as antimony trioxide, antimony pentoxide, and brominated epoxy resins, stress reducing agents, such as silicone, colorants, and so forth in ranges within the scope of the present invention.

The liquid epoxy resin composition can be prepared by, for example, mixing prescribed amounts of components (A), (B), (C) and (D) and necessary additives such as a cure accelerator and dispersively kneading the mixture under high shear by use of a three roll mill, a homomixer, etc. If necessary, the composition is degassed under reduced pressure. Where a prepolymer is to be formed between the liquid epoxy resin (A), particularly a polyfunctional aliphatic liquid epoxy resin, and the fluorine-containing aromatic diamine compound, these components are previously allowed to react as above stated, and a prescribed amount of the resulting prepolymer is compounded with prescribed amounts of other components.

The electronic component according to the present invention is produced as follows. A semiconductor chip having electrodes for interconnection (solder bumps) and a PCB having solder pads facing to the solder bumps are electrically connected by reflow. The liquid epoxy resin composition of the invention, which is a solventless one pack type composition, is infiltrated into the gap between the chip and the PCB by making use of capillarity and thermally cured to form a sealing resin layer to achieve resin sealing. There is thus produced an electronic component shown in FIG. 1, wherein the semiconductor chip 1 is face down mounted on the PCB 2 via solder joints between the solder bumps 3 and the solder pads 5, and the gap between the semiconductor chip 1 and the PCB 2 is filled with a sealing resin layer 4 formed of the liquid epoxy resin composition.

In filling the gap between the semiconductor chip (flip chip) 1 and the PCB 2 with the liquid epoxy resin composition, the resin composition is once charged into a syringe and extruded through the needle of the syringe to an end of the flip chip 1, whereupon the liquid composition infiltrates into the gap through capillarity. It is advisable to perform the underfill operation to place the PCB on a hot plate heated to about 60 to 150° C., preferably about 80 to 120° C., to reduce the viscosity of the liquid epoxy resin composition, which facilitates filling and sealing. The PCB may be tilted to further facilitate filling.

The distance (gap) between the flip chip 1 and the PCB 2 is generally about 30 to 300 μm.

The cured resin of the liquid epoxy resin composition which forms the sealing resin layer 4 of the electronic component is swellable with a specific organic solvent to reduce its adhesive strength, allowing the component to be repaired if rejected.

The specific organic solvent which can be used to solvate and swell the cured resin preferably includes ketone solvents, glycol diether solvents, and nitrogen-containing solvents. They may be used either individually or as a mixture of two or more thereof.

The ketone solvents include acetophenone, isophorone, ethyl n-butyl ketone, diisobutyl ketone, diethyl ketone, cyclohexyl ketone, di-n-propyl ketone, methyl oxide, methyl n-amyl ketone, methyl isobutyl ketone, methyl ethyl ketone, methylcyclohexanone, methyl n-heptyl ketone, and phorone. They may be used either alone or as a mixture thereof.

The glycol diether solvents include ethylene glycol diethyl ether, ethylene glycol dibutyl ether, ethylene glycol dimethyl ether, diethylene glycol ethyl methyl ether, diethylene glycol diethyl ether, diethylene glycol dibutyl ether, diethylene glycol dimethyl ether, and triethylene glycol dimethyl ether. They may be used either alone or as a mixture thereof.

The nitrogen-containing solvents include N,N'-dimethylformamide, N,N'-dimethylacetamide, N-methyl-2-pyrrolidone, N,N'-dimethyl sulfoxide, and hexamethylphosphoryltriamide. They may be used either alone or as a mixture thereof.

In performing repair of the electronic component of the present invention, the flip chip or the part of the PCB to be repaired is heated by use a hot plate, etc. to remove the chip. The heating temperature is at least about 50° C. higher than the glass transition temperature of the cured resin and also at or above the melting point of the bonding metal, e.g., solder. Thus, the chip and the PCB are easily separated apart with a cohesive failure of the cured resin or with the cured resin remaining adhered to either the chip or the PCB. Then, the cured resin remaining on the chip or the PCB is brought into contact with the above-recited organic solvent either by direct application or by applying cotton wad impregnated with the organic solvent at room temperature, preferably at or above the glass transition temperature of the cured resin. After confirming swelling, the residual cured resin is completely removed from the PCB or the chip, which can be reused for assembly. On the other hand, the semiconductor chip (flip chip) on which the residual cured resin of the liquid epoxy resin composition is adhered is soaked in the above-recited organic solvent in a prescribed vessel at a room temperature, preferably brought into contact with the organic solvent at or above the glass transition temperature of the cured resin, swelled, and removed from the chip, which can be reused for assembly.

It is also possible, while requiring a longer time, that the whole part of the PCB to be repaired is coated with the organic solvent either by direct application or by means of cotton wad impregnated with the organic solvent to make the solvent gradually penetrate from the periphery of the chip and swell the cured resin thereby reducing the strength and adhesion of the cured resin. The chip is then removed from the PCB.

The present invention will now be illustrated in greater detail with reference to Examples. The following materials were prepared to carry out Examples and Comparative Examples.

Liquid Epoxy Resin a

Epoxy resin represented by formula (III):

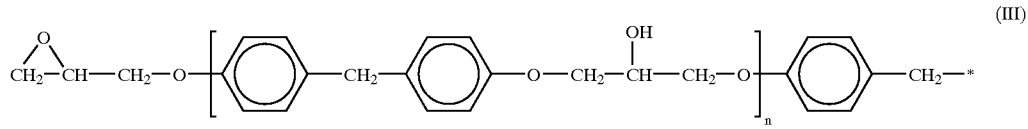

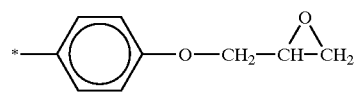

(wherein n is 0 or a greater integer; purity: 99%; viscosity (25° C.): 22 dPa·s; epoxy equivalent weight: 165 g/eq)

Liquid Epoxy Resin b

Polyfunctional epoxy compound represented by formula (IV):

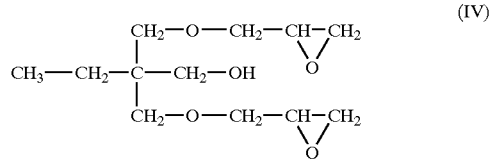

(viscosity (25° C.): 0.6 dPa·s; epoxy equivalent weight: 125 g/eq)

Liquid Epoxy Resin c

Epoxy resin represented by formula (V):

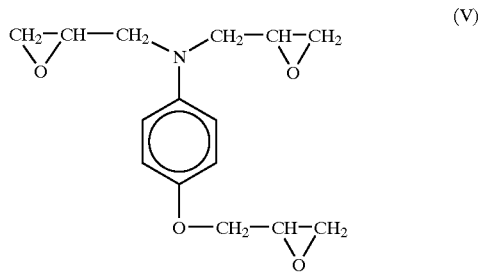

(viscosity (25° C.): 6.3 dPa·s; epoxy equivalent weight: 93 g/eq)

Curing Agent a

Fluorine-containing aromatic diamine (2,2'-ditrifluoromethyl-4,4'-diaminobiphenyl) represented by formula (VI):

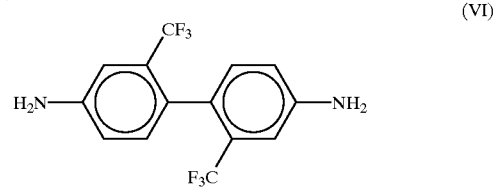

(melting point: 182° C.; active hydrogen equivalent weight: 80 g/eq)

Curing Agent b

Fluorine-containing aromatic diamine derivative represented by formula (VII), which was prepared from 1 mol of 2,2'-ditrifluoromethyl-4,4'-diaminobiphenyl represented by formula (VI) and 0.5 mol of butyl glycidyl ether at 200° C.

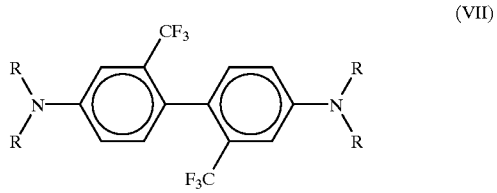

(wherein 3.5 Rs out of 4 in average are hydrogen, and 0.5 R in average is $-CH_2-CH(OH)CH_2-O-C_4H_9$; average active hydrogen equivalent weight: 110 g/eq)

Curing Agent c

Fluorine-free aromatic diamine (m-phenylenediamine) represented by formula (VIII):

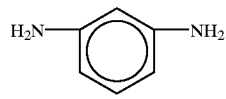
(VIII)

(melting point: 64° C.; active hydrogen equivalent weight: 27 g/eq)

Curing Agent d

Fluorine-free aromatic diamine derivative represented by formula (IX), which was prepared from 1 mol of m-phenylenediamine of formula (VIII) and 0.5 mol of butyl glycidyl ether at 200° C.

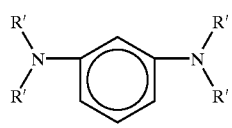
(IX)

(wherein 3.5 R's out of 4 in average are hydrogen, and 0.5 R' in average is —$CH_2$—$CH(OH)CH_2$—O—$C_4H_9$; average active hydrogen equivalent weight: 49.4 g/eq) N,N,N',N'-Tetrasubstituted Fluorine-Containing Aromatic Diamine Derivative Represented by Formula (X):

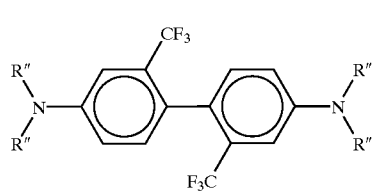
(X)

(wherein R" is —$CH_2$—CH(OH)$CH_2$—O—$C_4H_9$)

Prepolymer a (F-Containing)

Highly viscous prepolymer (active hydrogen equivalent: 325) obtained by allowing the fluorine-containing aromatic diamine of formula (VI) and the epoxy resin of formula (III) to react with each other at a ratio of 1 active hydrogen equivalent of (VI) (80 g) to 0.5 epoxy equivalent of (III) (82.5 g) at 150° C. for 15 minutes.

Prepolymer b (F-containing)

Prepolymer (viscosity: 10 dPa·s; weight average molecular weight: 560) obtained by allowing 1 mol of the fluorine-containing aromatic diamine derivative of formula (VII) and 4 mol of the aliphatic polyfunctional epoxy resin of formula (IV) to react at 100° C. for 10 minutes.

Inorganic Filler

Spherical silica powder having a maximum particle size of 12 μm, an average particle size of 4 μm, and a specific surface area of 3.0 $m^2$/g.

EXAMPLES 1 TO 18 AND COMPARATIVE EXAMPLES 1 TO 3

The components prepared were compounded according to the formulations (unit: part by weight) shown in Tables 1 and 2 below and uniformly mixed in a three roll mill at room temperature (25° C.) to prepare solventless one pack liquid epoxy resin compositions.

TABLE 1

| | | Example | | | | | | | | | | |
|---|---|---|---|---|---|---|---|---|---|---|---|---|
| | | 1 | 2 | 3 | 4 | 5 | 6 | 7 | 8 | 9 | 10 | 11 |
| Liquid Epoxy | a | 0.825 | 0.825 | 0.825 | 0.825 | 0.825 | 0.825 | 0.825 | 0.825 | 0.495 | 1.65 | — |
| Resin (A) | b | 0.625 | 0.625 | 0.625 | 0.625 | 0.625 | 0.625 | 0.625 | 0.625 | 0.875 | — | — |
| | c | — | — | — | — | — | — | — | — | — | — | 0.93 |
| Curing Agent | a | — | — | — | — | — | — | — | — | — | — | — |
| (B) | b | 0.88 | 0.88 | 0.88 | 0.88 | 0.22 | 0.66 | 1.32 | 1.76 | 1.10 | 0.88 | 0.88 |
| | c | — | — | — | — | — | — | — | — | — | — | — |
| | d | — | — | — | — | — | — | — | — | — | — | — |
| Component (D) * | | 1.55 | 1.00 | 2.33 | 3.49 | 1.11 | 1.41 | 1.85 | 2.14 | 1.65 | 1.69 | 1.21 |
| Prepolymer | a | — | — | — | — | — | — | — | — | — | — | — |
| | b | — | — | — | — | — | — | — | — | — | — | — |
| Inorganic Filler (C) | | 7.21 | 6.18 | 8.65 | 10.81 | 5.16 | 6.54 | 8.58 | 9.94 | 7.65 | 7.84 | 5.61 |
| Component (D) Content (wt %) ** | | 39.0 | 30.0 | 70.0 | 60.0 | 40.0 | 40.1 | 40.0 | 40.0 | 40.0 | 40.0 | 40.1 |

\* N,N,N',N'-Tetrasubstituted fluorine-containing aromatic diamine derivative.
\*\* Based on the total organic components.

TABLE 2

|  |  | Example |  |  |  |  |  |  | Compara. Example |  |  |
|---|---|---|---|---|---|---|---|---|---|---|---|
|  |  | 12 | 13 | 14 | 15 | 16 | 17 | 18 | 1 | 2 | 3 |
| Liquid Epoxy Resin | a | 0.825 | 0.825 | 0.825 | 0.413 | 0.825 | 0.825 | 0.825 | 0.825 | 0.825 | 0.825 |
| (A) | b | 0.625 | 0.625 | 0.625 | 0.625 | — | 0.625 | 0.625 | 0.625 | 0.625 | 0.625 |
|  | c | — | — | — | — | — | — | — | — | — | — |
| Curing Agent (B) | a | 0.64 | — | — | — | — | — | — | 0.64 | — | — |
|  | b | — | — | — | — | — | 0.88 | 0.88 | — | — | 0.241 |
|  | c | — | 0.216 | — | — | — | — | — | — | 0.216 | — |
|  | d | — | — | 0.40 | — | — | — | — | — | — | — |
| Component (D) * |  | 1.39 | 1.11 | 1.23 | 1.394 | 1.553 | 0.26 | 0.59 | — | — | — |
| Prepolymer | a | — | — | — | 1.053 | — | — | — | — | — | — |
|  | b | — | — | — | — | 1.505 | — | — | — | — | — |
| Inorganic Filler (C) |  | 6.46 | 5.16 | 5.72 | 6.47 | 7.26 | 4.81 | 5.75 | 3.881 | 10.27 | 3.14 |
| Component (D) Content (wt %) ** |  | 39.9 | 40.0 | 39.9 | 40.0 | 40.0 | 10.0 | 20.2 | — | — | — |

\* N,N,N',N'-Tetrasubstituted fluorine-containing aromatic diamine derivative.
\*\* Based on the total organic components.

The viscosity of the resulting liquid epoxy resin compositions was measured with a corn-plate viscometer (EMD viscometer, supplied by Tokyo Keiki K.K.) at 25° C. in accordance with JIS K7117-2.

Each of the compositions was put into a polypropylene syringe with needle of 0.56 mm in inner diameter and allowed to stand at 25° C. The time required for the viscosity to double was taken as a pot life.

A silicon chip (10 mm×10 mm×370 μm (t)) having 192 solder bumps of 200 μm in diameter arrayed in four rows at a pitch of 500 μm was placed face down on an FR-4 (copper-clad epoxy-glass laminate) PCB (1 mm (t)) having 192 solder paste pads of 240 μm in diameter, and the assembly was placed in a solder reflow furnace at 240° C. for 10 seconds to form solder joints. The stand-off gap between the silicon chip and the PCB was 180 μm.

The assembly was put on a hot plate at 105° C., and the liquid epoxy resin composition in the syringe was injected through the needle into the gap between the chip and the PCB by pushing the plunger of the syringe. The liquid epoxy resin composition, while being heated, filled the gap by capillarity. Then, the resin composition was cured at 150° C. to form a sealing resin layer to prepare an electronic component.

After completion of curing, the assembly was cooled to room temperature and inspected for any void in the sealing resin layer with a scanning acoustic tomograph and graded as follows.

A . . . No voids was observed.

B . . . One or two voids were observed.

C . . . More than two voids were observed.

The electronic components were evaluated for connection failure and repairability according to the following test methods. The results obtained are shown in Tables 3 and 4 together with the characteristics of the liquid epoxy resin compositions measured above.

Measurement of Connection Failure

Each electronic component immediately after underfilling was tested to measure a connection failure ratio. Thereafter, the component was subjected to a thermal cycling test at −40° C. and 125° C. each for 10 minutes. After 1000 full cycles were executed, electrical connection was again inspected for connection failure to calculate a ratio (%) of failures to 192 solder joints.

Evaluation of Repairability

The electronic component after having been subjected to a thermal cycling test was placed on a hot plate at 240° C., and the silicon chip was removed from the component. After cooling to room temperature, cotton wad impregnated with an equal weight mixture of N,N'-dimethylformamide and diethylene glycol dimethyl ether was placed on the residual sealing resin remaining on the joint part of each of the chip and the PCB and left to stand at room temperature (22° C.) for 1 hour. The cotton wad was removed, and the residual cured resin was wiped off with methanol. The electronic components from which the sealing resin had been able to be removed in this way were reworked by supplying solder paste to copper pads of the PCB, mounting the silicon chip on the PCB, reflowing, and sealing the gap with the liquid epoxy resin composition. The component immediately after reflowing was inspected for connection failure. Further, the component after sealing was evaluated for repairability (reworkability) and graded as follows.

AA . . . The cured resin is completely removable, and the repaired component achieves perfect interconnection.

A . . . The cured resin slightly remains unremoved, and yet the repaired component achieves perfect interconnection.

B . . . The cured resin slightly remains unremoved, and the repaired component fails to achieve perfect interconnection.

C . . . The cured resin is little removable, and the repaired component fails to achieve perfect interconnection.

TABLE 3

|  | Example |  |  |  |  |  |  |  |  |  |  |  |
|---|---|---|---|---|---|---|---|---|---|---|---|---|
|  | 1 | 2 | 3 | 4 | 5 | 6 | 7 | 8 | 9 | 10 | 11 | 12 |
| Viscosity (25° C.) (dPa · s) | 2160 | 2450 | 1600 | 1500 | 1430 | 1740 | ≧2500 | ≧2500 | 1480 | 2460 | 1880 | 600 |

TABLE 3-continued

| | Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Pot Life (25° C.) (hr) | 24 | 22 | 23 | 24 | 28 | 25 | 17 | 15 | 29 | 23 | 15 | 20 |
| Connection Failure Ratio (%) | 0 | 0 | 0 | 0 | 0 | 0 | 0 | 0 | 0 | 0 | 0 | 0 |
| Void | A | A | A | A | A | A | A | A | A | A | A | A |
| Repairability (22° C.) | AA | AA | AA | AA | AA | AA | AA | A | AA | AA | AA | A |

TABLE 4

| | Example | | | | | | Compara. Example | | |
|---|---|---|---|---|---|---|---|---|---|
| | 13 | 14 | 15 | 16 | 17 | 18 | 1 | 2 | 3 |
| Viscosity (25° C.) (dPa · s) | 410 | 560 | 620 | 2200 | 3030 | 2750 | 350 | 105 | 110 |
| Pot Life (25° C.) (hr) | 2 | 4 | 9 | 23 | 21 | 22 | 17 | 1 | 22 |
| Connection Failure Ratio (%) | 0 | 0 | 0 | 0 | 0 | 0 | 0 | 0 | 0 |
| Void | A | A | A | A | A | A | A | A | C |
| Repairability (22° C.) | A | A | A | AA | A | AA | C | C | AA |

It is seen from the results shown in Tables 3 and 4 that the liquid epoxy resin compositions of Examples are superior one-pack formulations with a long pot life and a low viscosity thereby capable of providing voidless underfill. The electronic components of Examples have no void in the sealing resin layer, suffer from no interconnection failure and exhibit excellent repairability. To the contrary, the epoxy resin compositions of Comparative Examples 1 and 2 are little repairable at room temperature, and the epoxy resin composition of Comparative Example 3, while repairable, suffers from void formation.

The liquid epoxy resin composition used as a sealing resin of the electronic device according to the present invention provides a voidless cured resin layer which is easily solvated and swellable with specific solvents at room temperature. As a result, it loses its strength and becomes removable from the adherends (electrodes, etc.). Therefore, the electronic device of the invention has high connection reliability and repairability in case of a connection failure due to misregistration in flip chip bonding and the like. In other words, the present invention enables electronic component manufacturing at high yield with little waste.

In particular, use of the derivative of formula (I) as component (D) provides a liquid epoxy resin composition the cured product of which exhibits rapid swellability to assure easy repairability.

Where the liquid epoxy resin composition contains a prepolymer formed between at least one fluorine-containing aromatic diamine compound of formula (II) as a curing agent (B) and a liquid epoxy resin (A), a further increased rate of curing results. In addition, the state of the epoxy resin composition to be used as an underfill material can be controlled between liquid to paste by using the prepolymer so that a liquid epoxy resin composition can be prepared with ease without involving complicated procedures in the steps of metering for compounding and subsequent dispersing.

While the invention has been described in detail and with reference to specific embodiments thereof, it will be apparent to one skilled in the art that various changes and modifications can be made therein without departing from the spirit and scope thereof.

What is claimed is:

1. An electronic component comprising a printed circuit board having electrodes for connection and a semiconductor chip having electrodes for connection which is mounted on said circuit board with their electrodes facing those of the circuit board, the gap between said circuit board and said semiconductor chip being filled with a sealing resin layer, wherein said sealing resin layer is formed of a liquid epoxy resin composition comprising (A) a liquid epoxy resin, (B) a curing agent, (C) an inorganic filler, and (D) an N,N,N',N'-tetrasubstituted fluorine-containing aromatic diamine derivative.

2. The electronic component according to claim 1, wherein said N,N,N',N'-tetrasubstituted fluorine-containing aromatic diamine derivative is represented by formula (I):

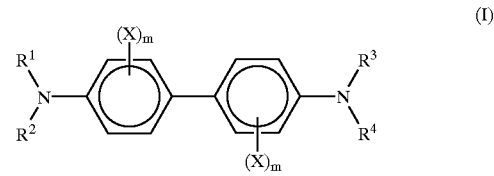

(I)

wherein X represents a fluorine atom, $C_nF_{2n+1}$ where n is an positive integer of 1 to 10, or a combination thereof; m represents a positive integer of 1 to 4; and $R^1$, $R^2$, $R^3$, and $R^4$, which may be the same or different, each represents a monovalent organic substituent other than a hydrogen atom.

3. The electronic component according to claim 1, wherein said N,N,N',N'-tetrasubstituted fluorine-containing aromatic diamine derivative is a reaction product between 2,2'-ditrifluoromethyl-4,4'-diaminobiphenyl and a monoepoxy compound having one epoxy group per molecule.

4. The electronic component according to claim 3, wherein said monoepoxy compound is at least one compound selected from the group consisting of n-butyl glycidyl ether, allyl glycidyl ether, 2-ethylhexyl glycidyl ether, styrene oxide, phenyl glycidyl ether, cresyl glycidyl ether, lauryl glycidyl ether, p-sec-butylphenyl glycidyl ether, nonylphenyl glycidyl ether, carbinol glycidyl ether, glycidyl methacrylate, vinylcyclohexene monoepoxide, and α-pinene oxide.

5. The electronic component according to claim 1, wherein said N,N,N',N'-tetrasubstituted fluorine-containing aromatic diamine derivative is present in an amount of 10 to 70% by weight based on the total organic components of said liquid epoxy resin composition.

6. The electronic component according to claim 1, wherein said N,N,N',N'-tetrasubstituted fluorine-containing aromatic diamine derivative is present in an amount of 20 to 40% by weight based on the total organic components of said liquid epoxy resin composition.

7. The electronic component according to claim 1, wherein said curing agent comprises at least one fluorine-containing aromatic diamine compound represented by formula (II):

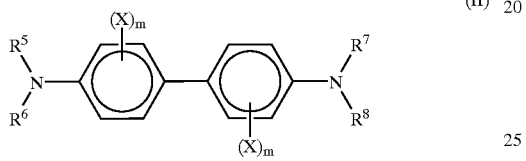

(II)

wherein X represents a fluorine atom, $C_nF_{2n+1}$ where n is an positive integer of 1 to 10, or a combination thereof; m represents a positive integer of 1 to 4; $R^5$, $R^6$, $R^7$, and $R^8$, which may be the same or different each represents a hydrogen atom or a monovalent organic substituent, provided that at least one of $R^5$, $R^6$, $R^7$, and $R^8$ is a hydrogen atom.

8. The electronic component according to claim 1, wherein said liquid epoxy resin composition comprises a prepolymer resulting from the reaction between at least one fluorine-containing aromatic diamine compound represented by formula (II):

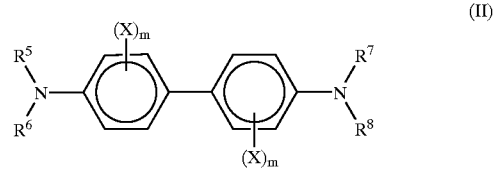

(II)

wherein X represents a fluorine atom, $C_nF_{2n+1}$ where n is an positive integer of 1 to 10, or a combination thereof; m represents a positive integer of 1 to 4; $R^5$, $R^6$, $R^7$, and $R^8$, which may be the same or different, each represents a hydrogen atom or a monovalent organic substituent, provided that at least one of $R^5$, $R^6$, $R^7$, and $R^8$ is a hydrogen atom, and said liquid epoxy resin (A).

9. The electronic component according to claim 1, wherein said inorganic filler is spherical silica powder having an average particle size of 10 μm or smaller.

10. The electronic component according to claim 1, wherein said curing agent is used in an amount of 0.4 to 1.6 in terms of the number of active hydrogen atoms per epoxy group of the liquid epoxy resin.

11. The electronic component according to claim 1, wherein said inorganic filler (C) is used in an amount of 10 to 80% by weight based on the liquid epoxy resin composition.

* * * * *